United States Patent
Hui et al.

[11] Patent Number: 6,136,649
[45] Date of Patent: Oct. 24, 2000

[54] METHOD FOR REMOVING ANTI-REFLECTIVE COATING LAYER USING PLASMA ETCH PROCESS AFTER CONTACT CMP

[75] Inventors: Angela T. Hui; Wenge Yang; Kashmir Sahota, all of Fremont; Mark T. Ramsbey, Sunnyvale; Suzette K. Pangrle, Cupertino; Minh Van Ngo, Fremont, all of Calif.

[73] Assignee: Advanced Micro Devices, Inc., Sunnyvale, Calif.

[21] Appl. No.: 09/416,389

[22] Filed: Oct. 12, 1999

[51] Int. Cl.[7] .................................................. H01L 21/336
[52] U.S. Cl. ........................ 438/257; 438/629; 438/631; 438/636; 438/724
[58] Field of Search ..................................... 438/625, 626, 438/629, 631, 636, 710, 723, 724, 735, 737, 743, 744; 438/197, 257, 279, 301, 585, 586, 597

[56] References Cited

U.S. PATENT DOCUMENTS

| | | | |
|---|---|---|---|
| 5,553,018 | 9/1996 | Wang et al. | 365/185.01 |
| 5,573,633 | 11/1996 | Gambino et al. | 156/636.1 |
| 5,643,833 | 7/1997 | Tsukamoto | 438/625 |
| 5,776,811 | 7/1998 | Wang et al. | 438/264 |
| 5,910,453 | 6/1999 | Gupta et al. | 438/717 |
| 5,920,796 | 7/1999 | Wang et al. | 438/700 |
| 5,990,002 | 11/1999 | Niroomand et al. | 438/636 |
| 6,001,541 | 12/1999 | Iyer | 430/322 |
| 6,013,582 | 1/2000 | Ionov et al. | 438/738 |

FOREIGN PATENT DOCUMENTS

| | | |
|---|---|---|
| 9-162280 | 6/1997 | Japan . |
| WO 99/16118 | 4/1999 | WIPO . |

*Primary Examiner*—T. N. Quach
*Attorney, Agent, or Firm*—Mikio Ishimaru

[57] ABSTRACT

The present invention provides a method for selectively removing anti-reflective coating (ARC) from the surface of a dielectric layer over the surface of a substrate without scratching the dielectric layer and/or tungsten contacts formed therein. In one embodiment, a fluoromethane ($CH_3F$)/oxygen ($O_2$) etch chemistry is used to selectively remove the ARC layer. The $CH_3F/O_2$ etch chemistry etches the ARC layer at a rate which is significantly faster than the etch rates of the dielectric layer or the tungsten contacts.

20 Claims, 8 Drawing Sheets

METHOD FOR REMOVING ANTI-REFLECTIVE COATING LAYER USING PLASMA ETCH PROCESS AFTER CONTACT CMP

CROSS-REFERENCE TO RELATED APPLICATION

The present application contains subject matter related to a concurrently filed U.S. patent application Ser. No. 09/416,382 filed Oct. 12, 1999 by Angela T. Hui, Wenge Yang, Kashmir S. Sahota, Mark T. Ramsbey, Suzette K. Pangrle, and Minh Van Ngo entitled "METHOD FOR REMOVING ANTI-REFLECTIVE COATING LAYER USING PLASMA ETCH PROCESS BEFORE CONTACT CMP". The related application is assigned to Advanced Micro Devices, Inc. and is identified by docket number D981.

TECHNICAL FIELD

The present invention relates generally to semiconductors and more specifically to an improved fabrication process for making semiconductor memory devices.

BACKGROUND ART

In general, memory devices such as a Flash electrically erasable programmable read only memory (EEPROM) are known. EEPROMs are a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped, shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric or tunnel oxide layer formed on the surface of a substrate overlying the channel region; a polysilicon floating gate overlying the tunnel oxide; an interpoly dielectric overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

The process of forming Flash EEPROM cells is well known and widely practiced throughout the semiconductor industry. After the formation of the memory cells, electrical connections, commonly known as "contacts", must be made to connect the stack gated structure, the source region and the drain regions to other parts of the chip. The contact process starts with the formation of sidewall spacers around the stacked gate structures of each memory cell. A liner material, typically of a high temperature oxide (HTO), is then formed over the entire substrate, including the stacked gate structure, using conventional techniques, such as chemical vapor deposition (CVD). A dielectric layer, generally of oxide, is then deposited over the etch stop layer, and a layer of photoresist is placed over the dielectric layer and photolithographically processed to form the pattern of contact openings. An anisotropic etch is then used to etch out portions of the dielectric layer to form gate, source and drain contact openings in the dielectric layer. The contact openings stop at the source and drain in the substrate, and the gate contact openings stop at the silicide layer on the stacked gate structure. The photoresist is then stripped, and a conductive material, such as tungsten, is deposited over the dielectric layer and fills the gate, source and drain contact openings. The substrate is then subjected to a chemical-mechanical polishing (CMP) process which removes the conductive material above the dielectric layer to form the contacts through a contact CMP process.

For miniaturization, it is desirable to dispose adjacent stacked gate structures as closely together as possible. In the conventional process, the formation of the contact mask does not require the use of an anti-reflective coating (ARC) on the dielectric layer. An ARC is typically formed of a material such as silicon oxynitride or silicon nitride and is used for enhancing the imaging effect in subsequent photolithography processing associated with the formation of a contact mask. When the contact size is less than or equal to 0.35 micron, an ARC must be used to meet the increasingly critical dimension requirements of such devices.

One significant problem with using an ARC on the dielectric layer is that after the formation of conductive contacts, the ARC layer needs to be removed in order for the ultraviolet erase process to work on the Flash memories. The CMP removal of the ARC will also remove portions of the conductive contacts as well as the dielectric layer, producing deep scratches therein. The scratches vary significantly from cell to cell, creating non-uniformity and adversely affecting device performance. Attempts have been made to develop an etch chemistry that is more selective so that the ARC is etched at a much higher rate than the conductive contacts and the dielectric layer.

A solution, which would selectively remove the ARC from the surface of a dielectric layer over the surface of a substrate for 0.35 micron or sub-0.35 micron devices without scratching the dielectric layer and/or conductive contacts formed therein, has long been sought but has eluded those skilled in the art. As miniaturization continues at a rapid pace in the field of semiconductors, it is becoming more pressing that a solution be found.

DISCLOSURE OF THE INVENTION

The present invention provides an improved method for making 0.35 micron or sub-0.35 micron semiconductor devices.

The present invention provides a method for selectively removing anti-reflective coating (ARC) from the surface of a dielectric layer over the surface of a substrate without scratching the dielectric layer and/or conductive contacts formed therein.

The present invention further provides a method for using a fluoromethane ($CH_3F$)/oxygen ($O_2$) etch chemistry to selectively remove an ARC layer without the scratching and/or degradation of a dielectric layer formed over a substrate and of conductive contacts formed in the dielectric layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
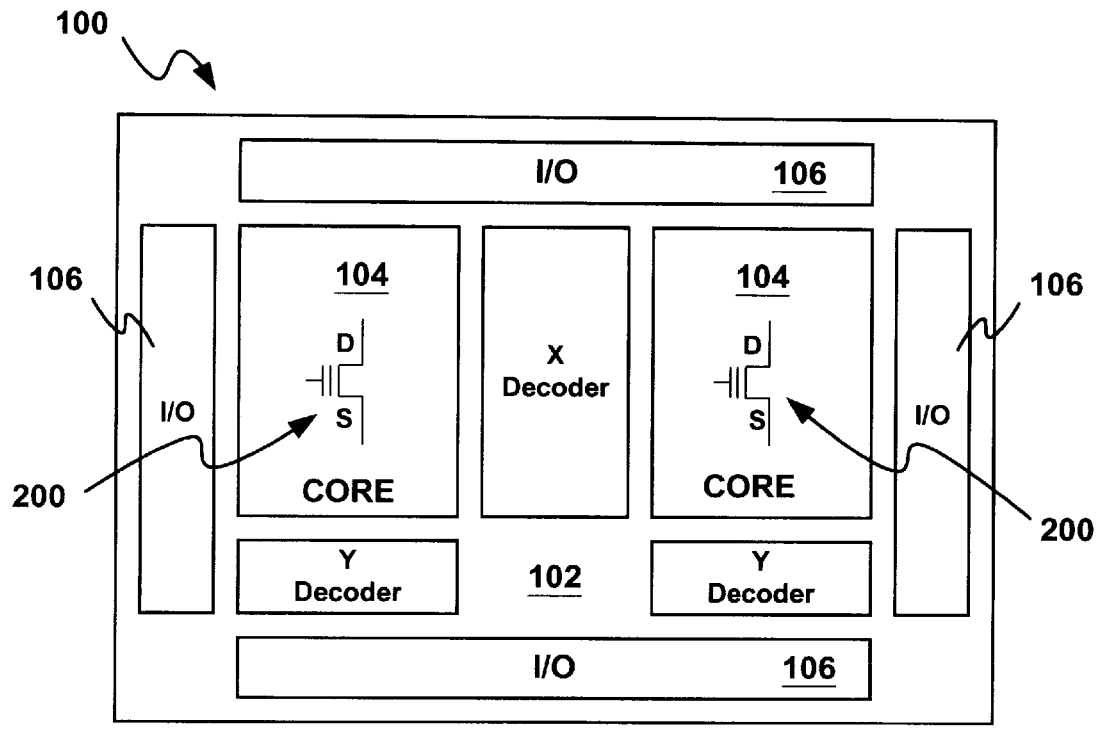
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances, to effect designated operations on the cell, e.g., programming, reading and erasing, and deriving necessary voltages to effect such operations.

Figure 2A:
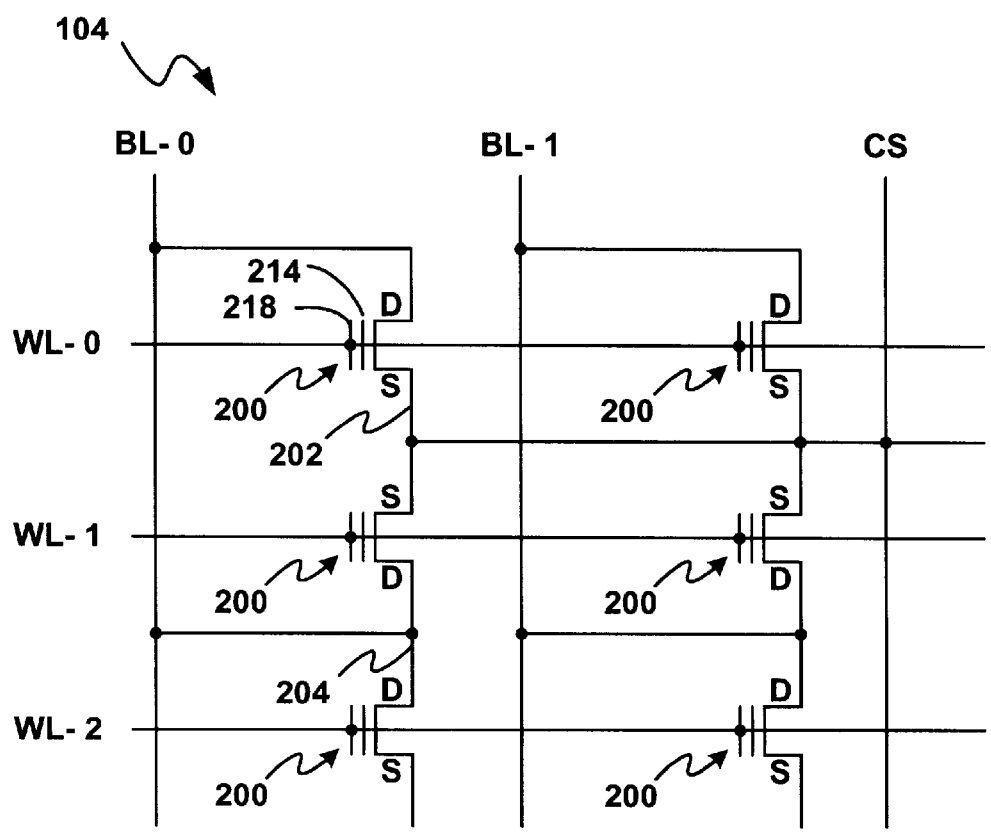
FIG. 2A (PRIOR ART) is schematic diagram of a portion of a memory cell array.
Figure 2B:
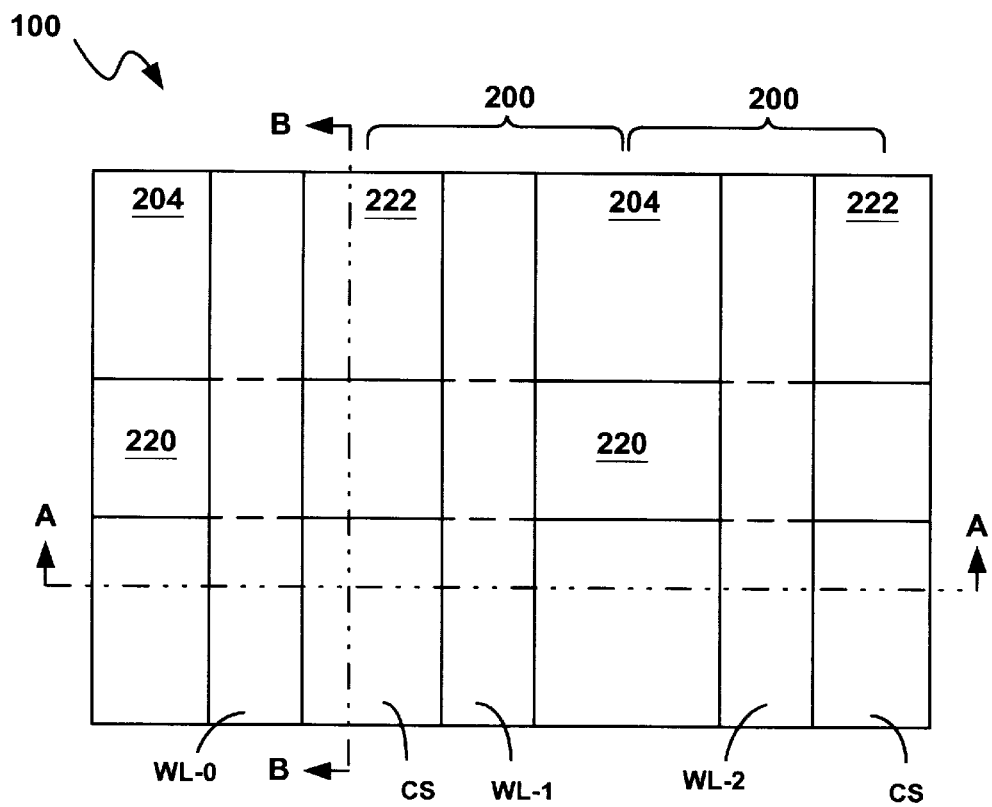
FIG. 2B (PRIOR ART) is a plan view of a portion of an intermediate state (partially complete) of a cell array core.
Figure 2C:
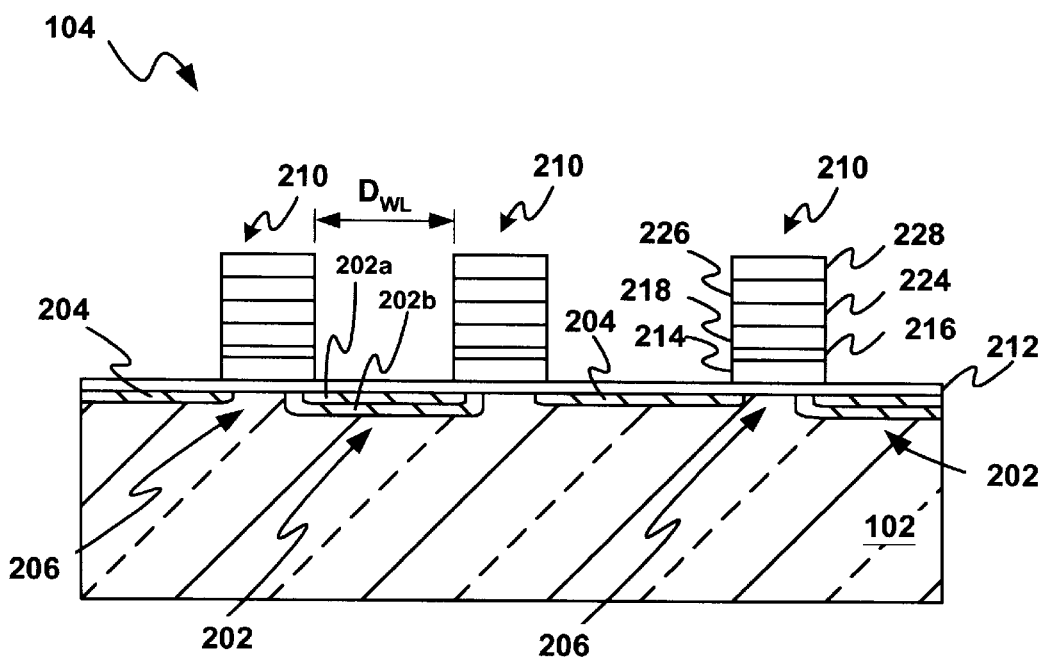
FIG. 2C (PRIOR ART) is a simplified cross section of FIG. 2B (PRIOR ART) along line A—A.

Referring now to FIG. 2A (PRIOR ART), therein is shown a schematic diagram of a portion of a memory cell array in which each cell 200 in array core 104 typically comprises a source 202, a drain 204, and a channel 206 (shown in FIG. 2C (PRIOR ART)).

Referring now to FIG. 2B (PRIOR ART), therein is shown a plan view of a portion of an intermediate state (partially complete) of a cell array core 104.

Referring now to FIG. 2C (PRIOR ART), therein is shown a simplified cross section of FIG. 2B (PRIOR ART) along line A—A. The source 202, drain 204, and channel 206 semiconductor regions are shown formed in semiconductor substrate 102 (or in an isolation well); and a multi-layer structure, commonly referred to as a "stacked gate" (word line) structure 210. The stacked gate structure 210 includes: thin gate dielectric layer 212 (commonly referred to as the "tunnel oxide") formed on the surface of substrate 102 overlying the channel 206; a floating gate 214 overlying the gate dielectric layer 212; an interpoly (inter-gate) dielectric 216 overlying the floating gate 214; and a control gate 218 overlying the interpoly dielectric 216. Additional layers, such as a silicide layer 224 (disposed on the control gate 218), a poly cap layer 226 (disposed on the silicide layer 224), and a silicon oxynitride layer 228 (disposed on the poly cap layer 226) may be formed over the control gate 218. The cells 200 are arranged in a series of rows and columns.

In the completed array, the control gates 218 of the cells 200 in a row are formed integral to a common word line (WL) associated with the row. Columns of cells are arranged such that adjacent cells in a column share a common semiconductor region as a source or drain region. The source 202 of each cell in a column (except end cells) is formed in a common region with one of the adjacent cells, e.g., the preceding cell in the column. Likewise, the drain of the cell is formed in a common region with the drain 204 of the other adjacent cell, e.g., the next succeeding cell in the column (except end cells). The drain 204 of each cell in a column of cells is connected by a conductive bit line (BL) (FIG. 2A (PRIOR ART)), including an overlying layer of metal connected to each drain 204 of the cells 200 within the column. Additionally, the sources 202 of each cell 200 in a row (and hence pairs of rows) are interconnected by a common source line CS (FIG. 2A (PRIOR ART)) formed in the substrate 102, as will be described. Any particular cell 200 within the array cores 104 can be individually addressed (programmed and read) by operating upon one word line and one bit line.

Typically, in forming an EEPROM 100, a pattern of field oxide regions 220 (FIG. 2B (PRIOR ART)) is initially formed to provide electrical isolation between the respective devices of EEPROM 100. For example, field oxide regions 220 are used to provide isolation between the array cores 104 and the devices of peripheral portions 106, as well as between the various columns of cells 200 within the array cores 104. Field oxide regions 220 are conventionally formed using a mask and selective growth process: a layer of thermal oxide ("barrier oxide" or "pad oxide") is grown or deposited over the surface of the substrate 102; a mask, frequently composed of nitride, is deposited on the barrier oxide, and patterned to cover those regions of the substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying substrate 102. In general, referring to FIG. 2B (PRIOR ART), within the array cores 104, the selective growth process results in alternating parallel strips of field oxide regions 220 and exposed regions corresponding to the columns of cells 200 in the array.

The stacked gate (word line) structures 210 are then typically formed. For example, gate dielectric layer 212, comprising a thin (e.g. approximately 100 angstroms) layer of oxide, is initially formed on the substrate 102 by a technique, such as thermal oxidation of the surface of the substrate 102 or by depositing a suitable material on the substrate 102. A layer of conductive polysilicon (e.g., polycrystalline silicon), that will ultimately form the floating gates 214, is typically then formed on the gate dielectric layer 212. For example, conductive polysilicon may be deposited by a number of different techniques, e.g., furnace grown polysilicon. The polysilicon layer is typically then masked and etched to remove strips overlying the field oxide regions 220, leaving isolated strips of polysilicon on top of the gate dielectric layer 212 overlying the substrate regions corresponding to the columns of cells 200 of the array core 104 (i.e. the regions in which source, channel, and drain regions of cells in the column will be formed). A layer of dielectric material, such as, e.g., an oxide-nitride-oxide (ONO) layer, that will ultimately form interpoly dielectric 216 is typically then formed by a suitable technique. For example, where the interpoly dielectric 216 is ONO, it is formed by growing a layer of oxide, depositing a layer of nitride, followed by growing another layer of oxide. The interpoly dielectric 216, in the completed array, insulates control gates 218 from floating gates 214 in the individual cells and electrically isolates the adjacent columns of the floating gates 214 in the array core 104. Another layer of conductive polysilicon (e.g., polycrystalline silicon), that will ultimately form the control gates 218 and the word lines WL connecting the control gates 218 of the cells in the respective rows of the array core 104, referred to as the control gate 218, is typically then thermally grown on the interpoly dielectric 216. Portions of the control gate 218 and the interpoly dielectric 216 are typically then selectively removed to define the stacked gate structures 210 on the gate dielectric layer 212, i.e., to form the floating gates 214, the interpoly dielectric 216, control gates 218 of the individual cells, and the word lines WL (portions of the interpoly dielectric 216 and control gate polysilicon layer bridge field oxide regions 220 to connect the respective cells of the rows of the core array). This is typically effected by masking and etching techniques.

When completed, this etch creates the generally parallel, stacked gate (word line) structures 210 separated by a distance DWL, as shown in FIG. 2C (PRIOR ART). A silicide layer 224 is typically provided over the control gate 218 layer to reduce resistance. Thereafter, a polysilicon layer (commonly referred to as a "poly cap" layer) 226 is formed over the silicide layer 224 to serve as a cap layer for the stacked gate structure 210. Next, a silicon oxynitride layer 228 may be formed over the poly cap layer 226. The combination of the poly cap layer 226 and the silicon oxynitride layer 228 is commonly referred to as a "passivation layer". Thereafter, portions of the silicon oxynitride layer 228 are partially removed using conventional masking and etching techniques to define the final stacked gate structure 210.

Conventionally, the portions of the field oxide regions 220 and the gate dielectric layer 212 between every second pair of adjacent stacked gate (word line) structures 210 in the array core 104 (i.e., the regions, generally indicated as 222, where the sources 202 are to be formed and the portions of the field oxide regions 220 disposed between sources 202 of the corresponding cells of adjacent columns) are then typically removed in preparation for formation of the common line CS (not shown)) connecting the sources 202. This is typically effected using a conventional Self-Aligned Source (SAS) etch.

Figure 2D:
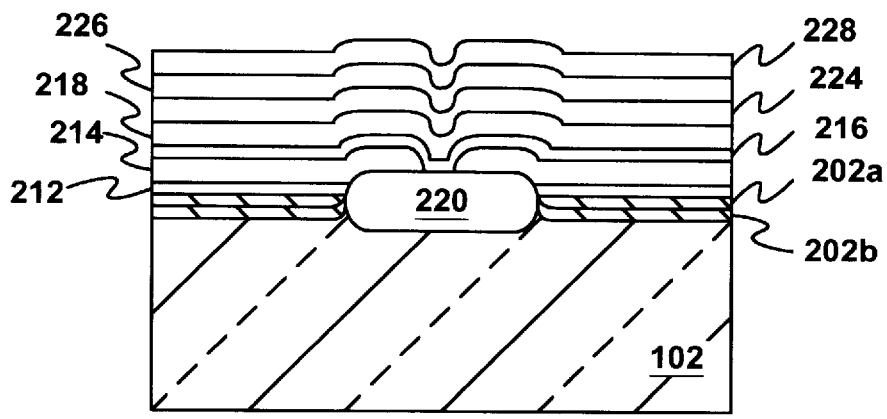
FIG. 2D (PRIOR ART) is a simplified cross section of FIG. 2B (PRIOR ART) along line B—B.

Referring now to FIG. 2D (PRIOR ART), therein is shown a simplified cross-section of FIG. 2B (PRIOR ART) along B—B for purposes of clarity. The source 202, common line CS, and drain 204 regions are formed in a conventional process. The source 202 and the common source line CS are typically formed by initially effecting a conventional double diffusion implant (DDI) with the SAS mask still in place. The DDI implants a first dopant (e.g. n-type, such as phosphorous) to form a deeply diffused, but lightly doped, N well 202a establishing a graded source-channel junction as shown in FIG. 2D (PRIOR ART) which is a simplified cross section of FIG. 2B (PRIOR ART) along line B—B. The SAS mask is then removed. The DDI implant is typically driven deeper into the substrate 102 by subjecting the substrate 102 to a thermal cycle at high temperature (e.g. 1050 degrees Celsius). A shallow second implant, commonly referred to as a medium diffused drain (MDD) implant, is then performed (e.g., with arsenic) to create a more heavily doped, but shallower, n+ well 202b embedded within deep N well 202a. The MDD implant also forms a shallow, abrupt drain 204.

Figure 3A:
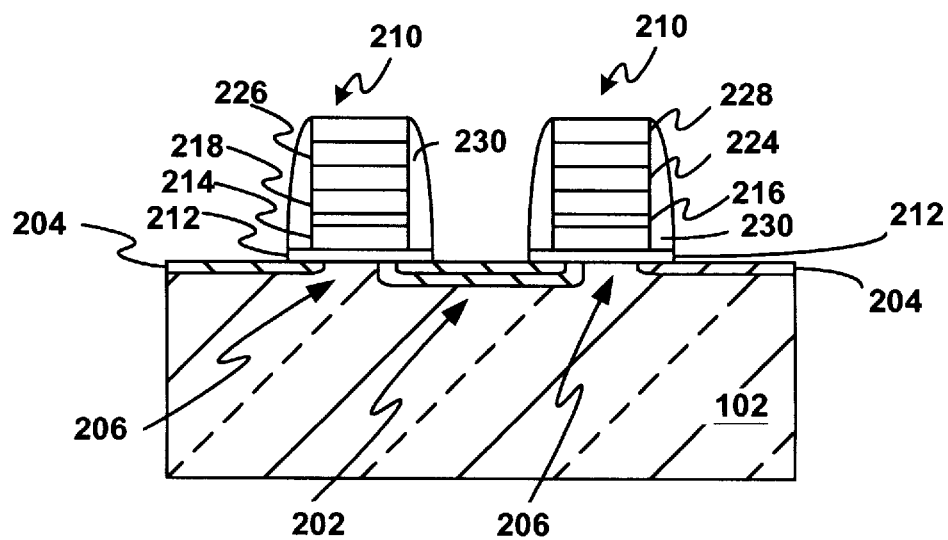
FIGS. 3A (PRIOR ART) through 3E (PRIOR ART) illustrate the sequence of process steps of a conventional process for forming source/drain (S/D) and control gate contacts, without the use of an ARC layer.

Referring now to FIGS. 3A (PRIOR ART) through 3E (PRIOR ART), therein is shown the sequence of process steps of a conventional process for forming source/drain (S/D) and control gate contacts without the use of an anti-reflective coating (ARC) layer. FIG. 3A (PRIOR ART) shows the formation of sidewall spacers 230 around the stacked gate structures 210. The sidewall spacers 230 are formed of a high temperature thermally grown oxide material using various etching techniques. At this stage the gate dielectric layer 212 in other areas of the substrate 102 is also removed during the etch of the sidewall spacers 230.

Figure 3B:
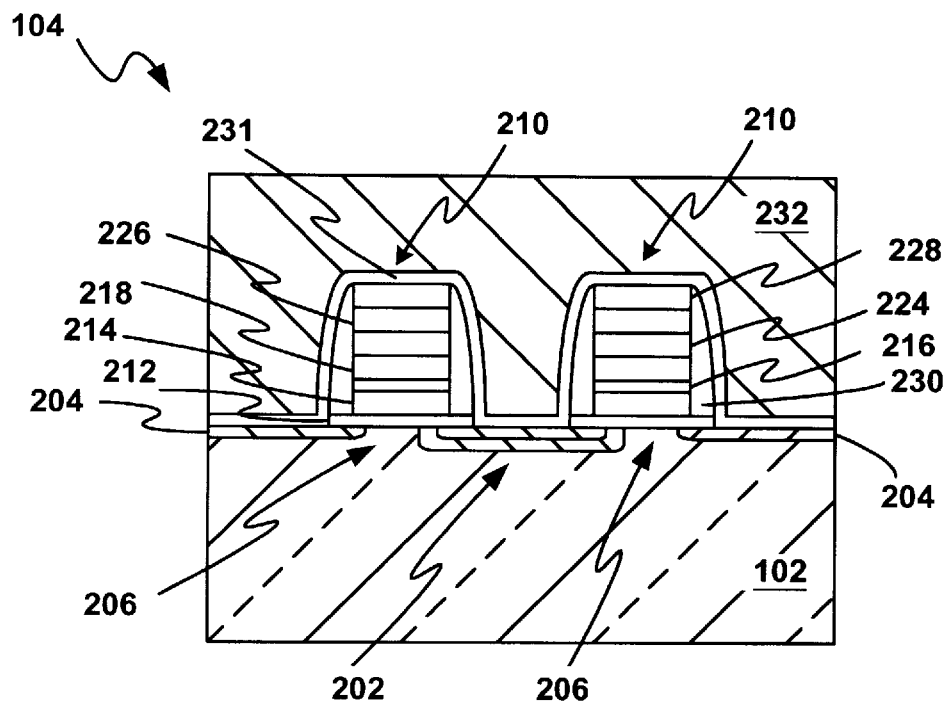

FIG. 3B (PRIOR ART) shows the deposition of a liner layer 231, or high temperature oxide (HTO), over the entire substrate 102, including over the stacked gate structures 210 which is thermally grown. A dielectric layer 232 is then deposited over the liner layer 231. The dielectric layer 232 may include boro-phospho-tetra-ethyl-ortho silicate (BPTEOS) formed using plasma enhanced chemical vapor deposition (PECVD).

Figure 3C:
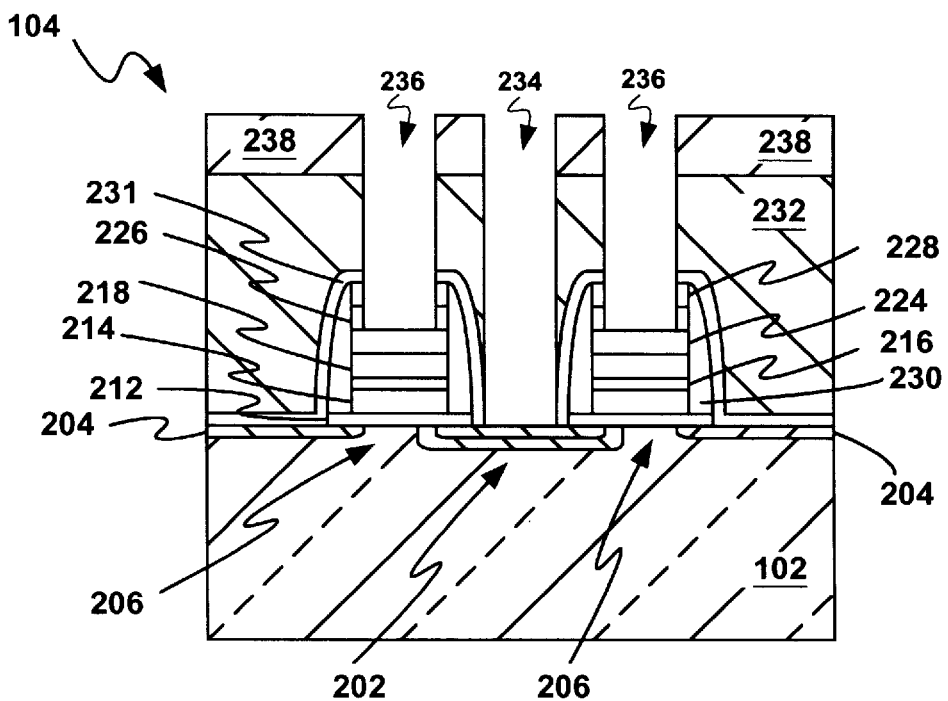

FIG. 3C (PRIOR ART) shows the formation of source/drain (S/D) contact opening 234 and control gate contact openings 236 in the dielectric layer 232, through liner layer 231, using a contact mask 238, to expose portions of the source 202 and silicide layer 224 on the stacked gate structures 210. For simplicity of illustration, one S/D contact opening 234 and two contact openings 236 are shown in the same plane. The S/D contact opening 234 and the contact openings 236 are formed conventionally using a one-step etch process. This etch process is able to etch through both the silicon oxynitride layer 228 and the poly cap layer 226 to stop on the silicide layer 224 while the S/D contacts are still etching.

Figure 3D:
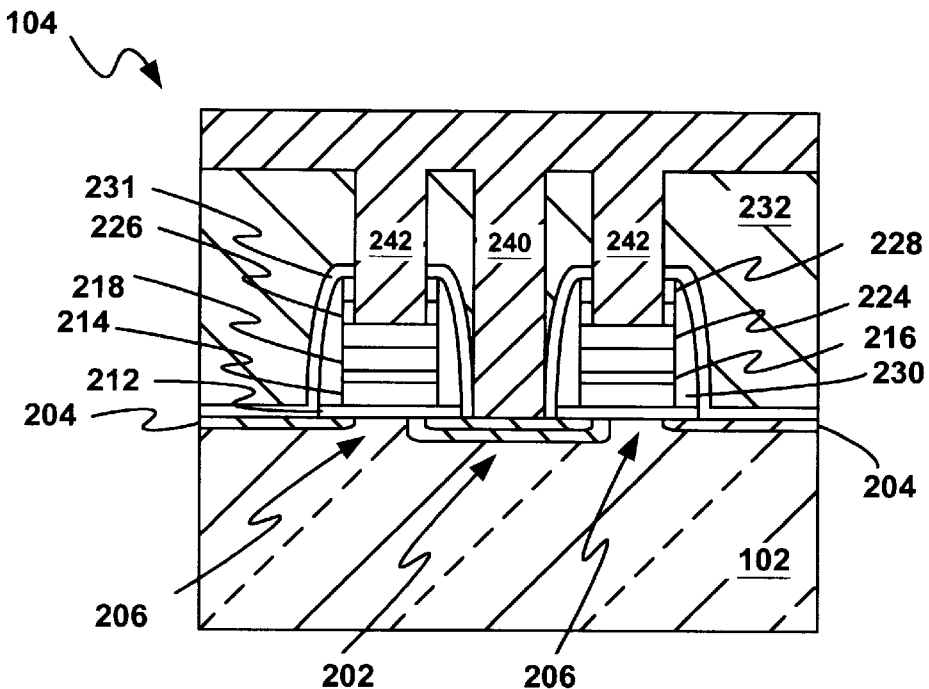

FIG. 3D (PRIOR ART) shows the removal of the contact mask 238 and the filling of the contact opening 236 with a conductive material which will form contacts 240 and 242, respectively. The conductive material typically is tungsten and may be formed using conventional metal deposition techniques. A barrier material (not shown), such as titanium (Ti)/titanium nitride (TiN), is typically deposited to coat the walls of the contact openings 234 and 236 prior to the deposition of the conductive material to ensure good adhesion and electrical contact to the walls of the contact openings 234 and 236 and the various silicide layers.

Figure 3E:
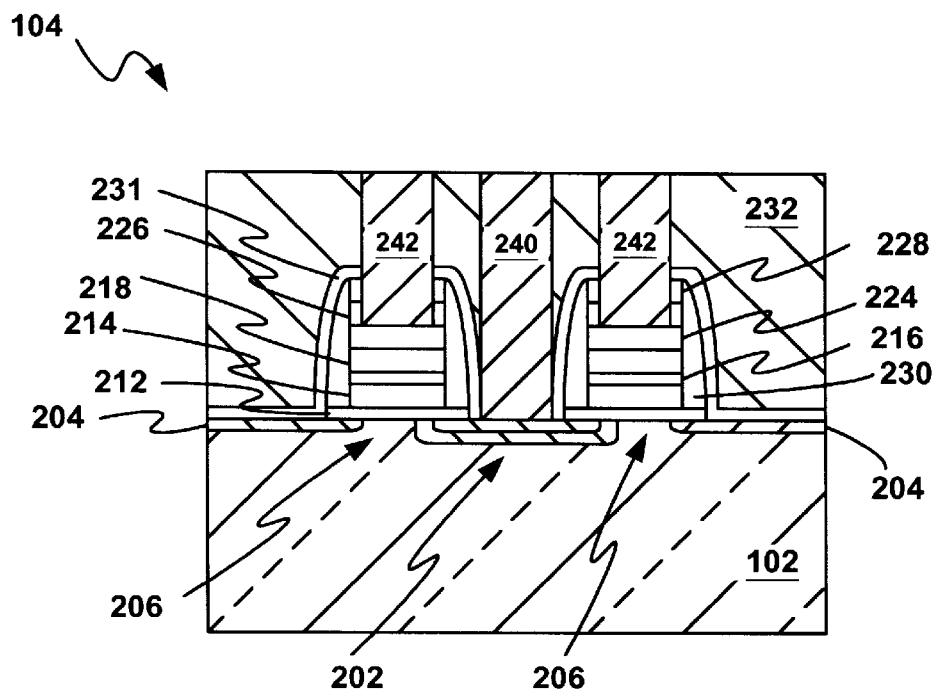

FIG. 3E (PRIOR ART) shows the removal of conductive material above the dielectric layer 232 using, for example, chemical-mechanical polishing techniques.

As explained in the BACKGROUND ART, for miniaturization, it is desirable to dispose adjacent word lines as closely together as possible, i.e., minimize distance $D_{WL}$. Specifically, for devices with contact sizes less than or equal to 0.35 micron, ARC must be used to meet the increasingly critical dimension requirement of such devices. One significant problem with using ARC on the dielectric layer 232 is that after the formation of conductive contacts or plugs, the removal of the ARC will also remove portions of the conductive contacts as well as the dielectric layer, producing scratches therein which adversely affect device performance.

The present invention provides a method for selectively removing ARC from the surface of a dielectric layer over the surface of a semiconductor substrate for 0.35 micron or sub-0.35 micron devices without scratching the dielectric layer and/or conductive contacts formed therein.

Referring now to FIGS. 4A through 4F, therein is shown the sequence of process steps for forming contacts in accordance with the present invention for fabricating an EEPROM device 100 on a semiconductor substrate 102. For convenience of illustration, like reference numerals are used in FIGS. 4A through 4E to denote like elements already described in FIGS. 1 (PRIOR ART), 2A (PRIOR ART) through 2D (PRIOR ART), and 3A (PRIOR ART) through 3E (PRIOR ART).

Figure 4A:
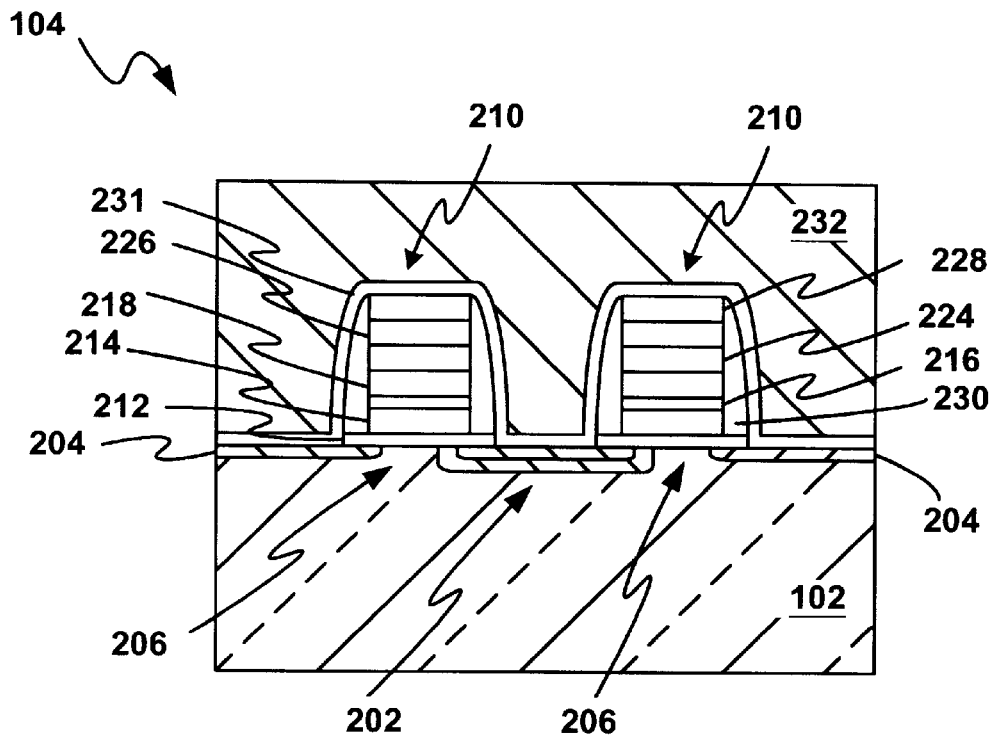
FIGS. 4A through 4F illustrate the sequence of process steps of a process in accordance with the present invention for forming source/drain (S/D) and control gate contacts using an ARC layer.

FIG. 4A shows a partial, sectional view of an intermediate state (partially complete) of a portion of a cell array core 104, similar to what was shown in FIG. 3B (PRIOR ART). At this stage is shown a pair of stacked gate structures 210 formed on a semiconductor substrate 102. A source 202 is formed between the two stacked gate structures 210. Drains 204 are formed on the semiconductor substrate 102 and are spaced apart from the source 202 by channels 206. Sidewall spacers 230 are formed around the stacked gate structures 210. The sidewall spacers 230 are formed using a thermally grown HTO material and various etching techniques. The gate dielectric layer 212 will be etched away during the etching of the sidewall spacers 230 except under the stack gate structures 210. A liner layer 231 is deposited over the entire substrate 102, including over the stacked gate structures 210 using a HTO thermally grown oxide. This is followed by the deposition of a dielectric layer 232 over the liner layer 231. The dielectric layer 232 may include boro-phospho-tetra-ethyl-ortho silicate (BPTEOS) formed using plasma enhanced chemical vapor deposition (PECVD).

In this embodiment, each of the stacked gate structures 210 includes a gate dielectric layer 212, a floating gate 214 disposed on the gate dielectric layer 212, an interpoly (inter-gate) dielectric 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

Figure 4B:
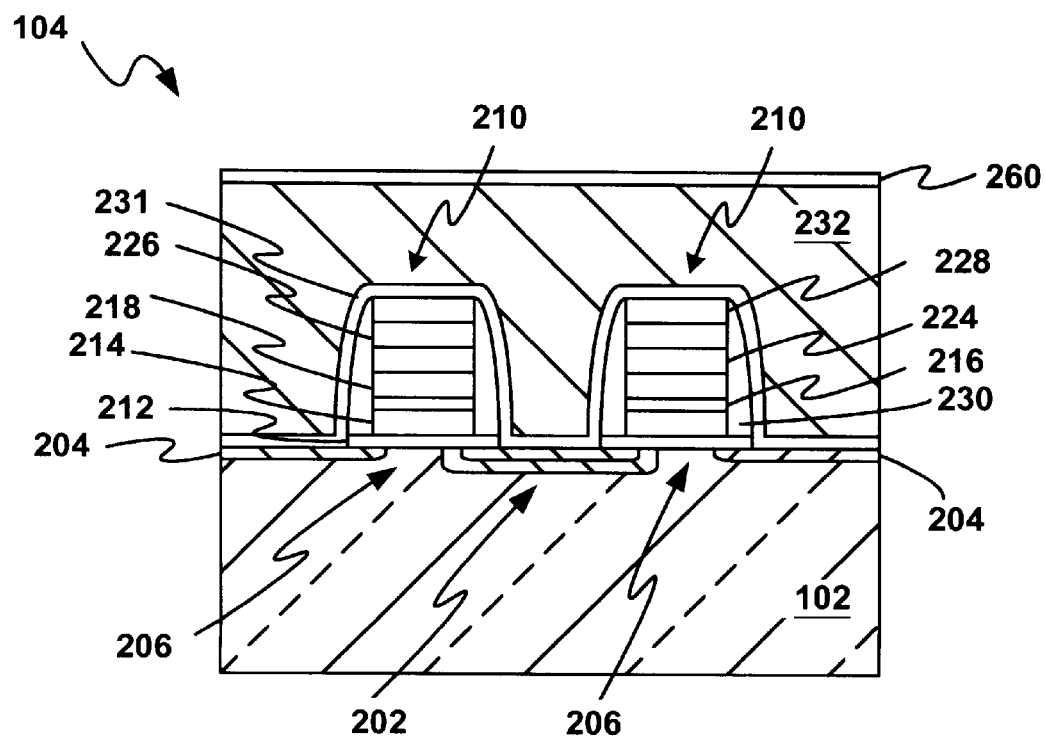

FIG. 4B shows the formation of an ARC layer 260 over the dielectric layer 232 in accordance with the present invention. In this embodiment, the ARC layer 260 includes a nitride or an oxynitride.

Figure 4C:
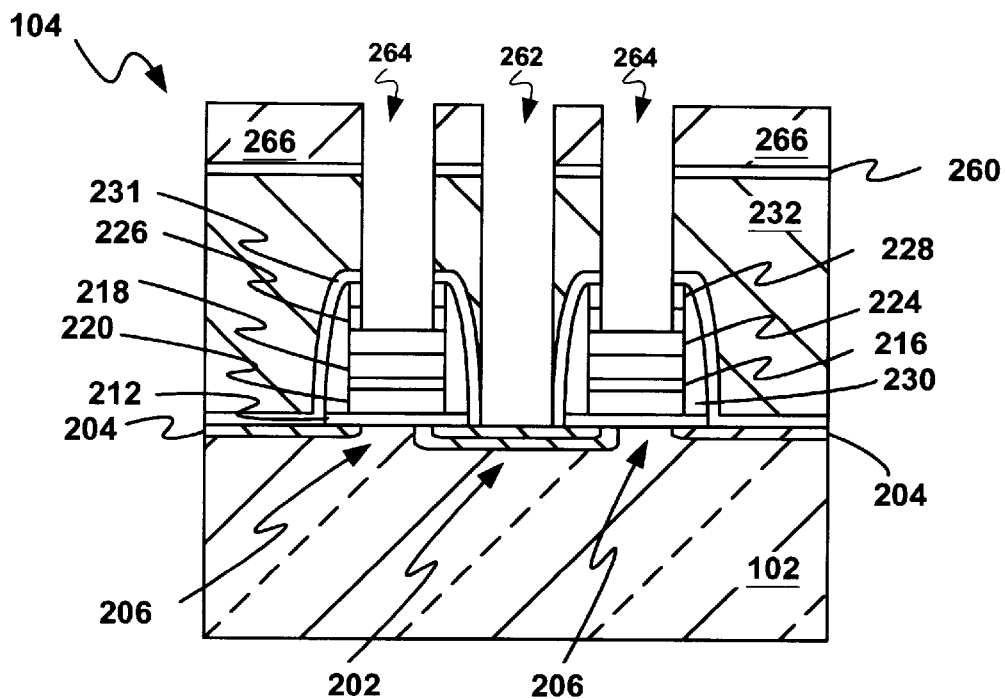

FIG. 4C shows the source/drain (S/D) contact opening 262 and control gate contact openings 264. These openings are formed by depositing the ARC layer 260 on the dielectric layer 232. A contact mask 266 is deposited on the ARC layer 260 and photolithographically exposed and developed to allow anisotropic etching in the developed areas to expose portions of the source 202 and silicide layer 224 on the stacked gate structures 210. For simplicity of illustration, one S/D contact opening 262 and two contact openings 264 are shown in the same plane. The S/D contact opening 262 and contact openings 264 are formed using either a one-step or two-step anisotropic etch process. The first etch process is a conventional ARC etch process which stops at the dielectric layer 232. The second etch process is a conventional etch process which etches through both the silicon oxynitride layer 228 and the poly cap layer 226 to stop on the silicide layer 224 while the S/D contacts are still etching. The process can also be simplified to use a one-step approach to clear ARC layer 260 and continue to etch through the silicon oxynitride layer 228 and the poly cap layer 226 to stop on the silicide layer 224 while the S/D contacts are still etching.

Figure 4D:
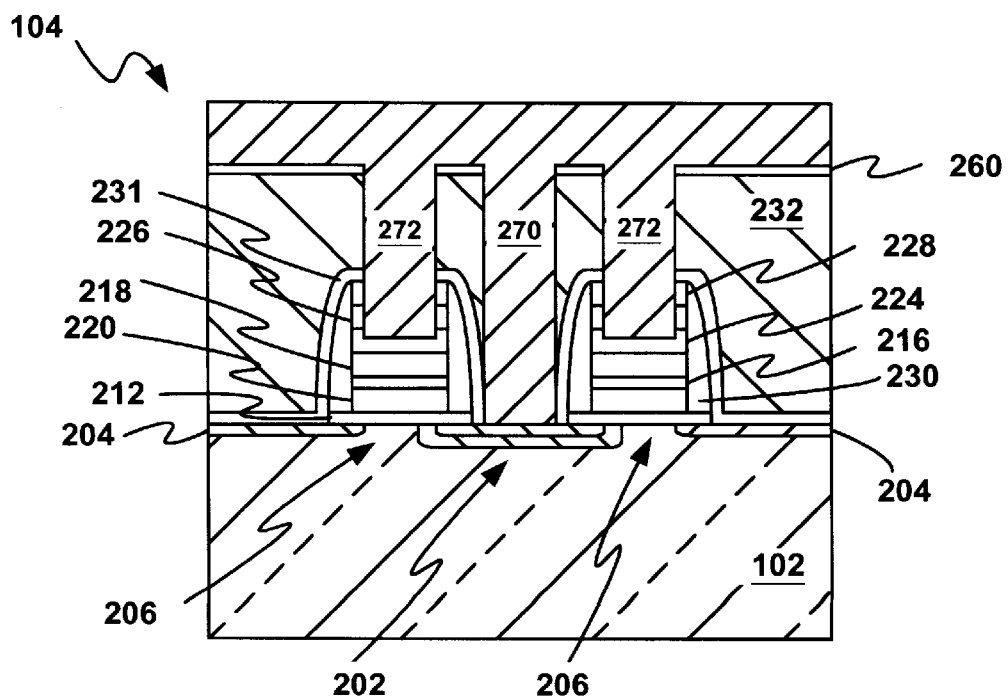

FIG. 4D shows the removal of the contact mask 266 and the filling of the contact openings 262 and 264 with a conductive material. The conductive material typically includes tungsten, tantalum and may be formed using conventional metal deposition techniques. In a preferred embodiment, the conductive material is tungsten.

Figure 4E:
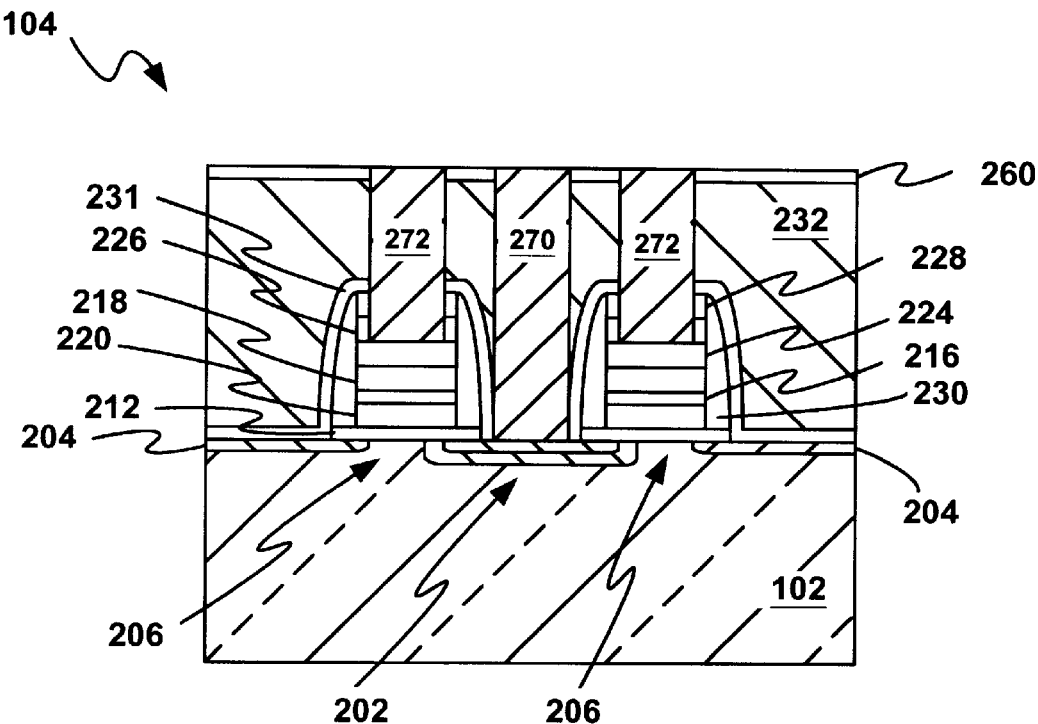

FIG. 4E shows the removal and planarization of the conductive material above the dielectric layer 232 using for example, chemical-mechanical polishing (CMP) technique. The conductive material is planarized until it is smooth with the top surface of the ARC layer 260 to form conductive contacts 270 and 272.

Figure 4F:
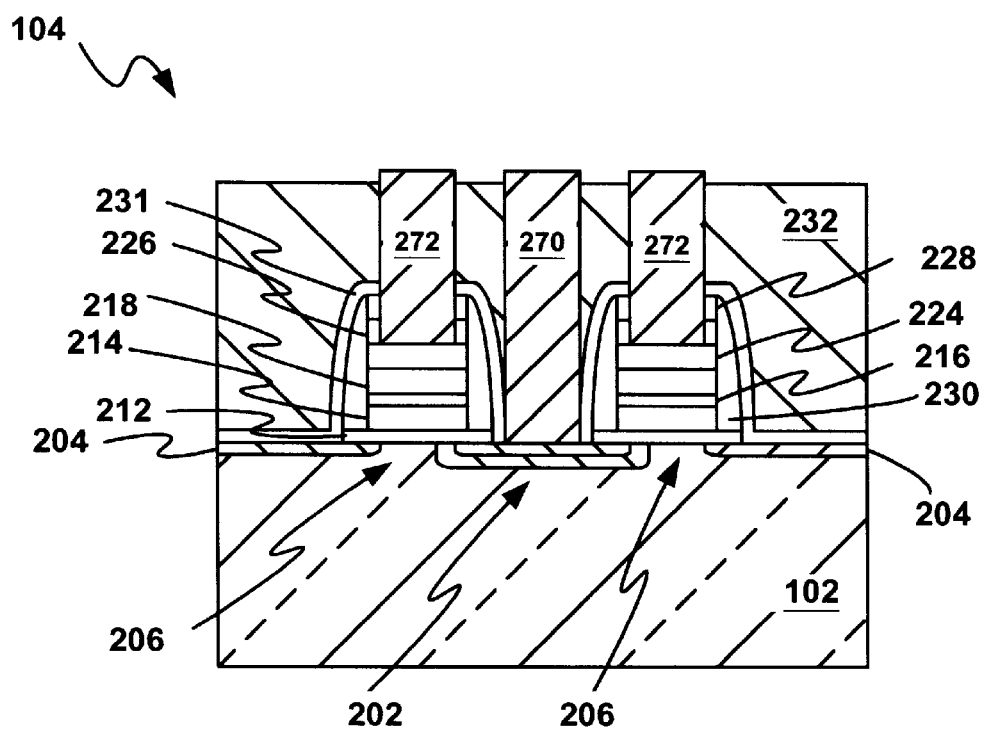

FIG. 4F shows the removal of the ARC layer 260 above the dielectric layer 232 using selective plasma etch to etch the ARC layer 260 with reactive ions at a rate that is significantly faster than the etch rates of the dielectric layer 232 or the conductive contacts 270 and 272. In a preferred embodiment, the plasma etch process uses a plasma generated by a combination of gaseous compounds which includes fluoromethane ($CH_3F$) and oxygen ($O_2$). With the use of $CH_3F/O_2$ etch chemistry, the etch rate for an ARC layer formed of silicon oxynitride is about fifteen times the etch rate for BPTEOS and even more for any of the conductive materials.

By using the $CH_3F/O_2$ etch chemistry in accordance with the present invention, an ARC layer can be selectively removed from the surface of a dielectric layer over the surface of a substrate for 0.35 micron or sub-0.35 micron devices without scratching the dielectric layer and/or conductive contacts formed therein.

In production, a plurality of stacked gate structures 210 are formed on a semiconductor substrate 102 using conventional techniques as shown in FIG. 4A. A source 202 is formed between the two stacked gate structures 210. Drains 204 are formed on the semiconductor substrate 102 and are spaced apart from the source 202 by channels 206. Sidewall spacers 230 are formed around the stacked gate structures 210. The sidewall spacers 230 are formed of a high temperature thermally grown oxide using various etching techniques. Except for the gate dielectric layer 212 located directly underneath the stack gates 210 and sidewall spacers 230, the gate dielectric layer 212 in other areas of the substrate 102 is then removed.

In this embodiment, each of the stacked gate structures 210 includes a gate dielectric layer 212, a floating gate 214 disposed on the gate dielectric layer 212, an interpoly (inter-gate) dielectric 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

A liner layer 231 is then deposited over the entire substrate 102, including over the stacked gate structures 210, using a high temperature thermal growing technique. The dielectric layer 232 may include BPTEOS formed using PECVD.

Thereafter, an ARC layer 260 is formed over the dielectric layer 232, as shown in FIG. 4B. The ARC layer 260 may be formed to a thickness in the range around 300 to 1100 angstroms (Å) using chemical vapor deposition (CVD), physical vapor deposition (PVD), or a combination thereof. In a preferred embodiment, the thickness of the ARC layer 260 is about 400 angstrom. The ARC layer 260 is formed of a material such as silicon oxynitride or silicon nitride.

Next, source/drain (S/D) contact opening 262 contact openings 264 are formed in the dielectric layer 232 using a contact mask 266 as a mask to expose portions of the source 202/drain 204, and portions of the silicide layer 224 on the stacked gate structures 210, as shown in FIG. 4C. The contact mask 266 is formed of a photoresist material deposited on the ARC layer 260. The ARC layer 260 permits better control over the size of features patterned by the photoresist material. As explained above, either a one-step or two-step anisotropic etch process can be used to remove ARC layer 260, dielectric layer 232, and liner layer 231.

Thereafter, the contact mask 266 is removed using a conventional photoresist stripping technique. The contact openings 262 and 264 are then filled with a conductive material to form conductive contacts 270 and 272, respectively, as shown in FIG. 4D. In one embodiment, the conductive material is tungsten and is formed using conventional metal deposition techniques.

After the formation of conductive contacts 270 and 272, conductive material above the dielectric layer 232 is removed using, for example, chemical-mechanical (CMP) polishing, as shown in FIG. 4E.

Next, the ARC layer 260 above the dielectric layer 232 is removed using selective plasma etch to etch the ARC layer 260 with reactive ions at a rate that is significantly faster than the etch rates of the dielectric layer 232 or the conductive material (FIG. 4F). In a preferred embodiment, the plasma etch process uses a plasma generated by a combination of gaseous compounds which includes $CH_3F$ and $O_2$.

After the removal of the ARC layer 260, an additional planarization step or etch-back may be used if required to planarize the conductive so that it is smooth with the top surface of By using the $CH_3F/O_2$ etch chemistry in accordance with the present invention, an ARC layer 260 can be selectively removed from the surface of a dielectric layer 232 over the surface of a substrate 10 for 0.35 micron or sub-0.35 micron devices without scratching the dielectric layer and/or conductive contacts formed therein. Accordingly, ARC layers may be used to enhance the imaging effect in the photolithography processing required by these 0.35-micron or sub-0.35 micron devices without adversely affecting device performance.

While the best mode utilizes tungsten as the conductive material, it should be understood that other materials selected from a group consisting of tantalum, titanium, copper, aluminum, gold, silver, alloys thereof, polysilicon, and compounds thereof may be used in the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device on a semiconductor substrate, comprising the steps of:
    forming a multi-layer structure on an active region on the semiconductor substrate;
    forming a source region and a drain region on said active region adjacent said multi-layer structure;
    forming sidewall spacers around said multi-layer structure;
    forming a dielectric layer over the semiconductor substrate, including said multi-layer structure, said sidewall spacers, said source region and said drain region;
    forming an anti-reflective coating layer over said dielectric layer, said anti-reflective coating layer having a top surface;
    forming a masking layer over said anti-reflective coating layer;
    patterning said masking layer to form a contact mask;
    forming a first opening and a second opening in said dielectric layer through said antireflective coating layer using said contact mask as a mask, said first opening exposes a portion of said source region and said second opening exposes a portion of said drain region;
    filling said first opening and said second opening with a conductive material;
    planarizing said conductive material smooth with said top surface of said antireflective coating layer; and
    removing said anti-reflective coating layer using selective plasma etch to etch said anti-reflective coating layer with reactive ions at a rate which is significantly faster than the etch rates of said dielectric layer or said conductive material.

2. The method as claimed in claim 1 wherein said multi-layer structure comprises a gate dielectric layer, a floating gate disposed on said gate dielectric layer, an inter-gate dielectric disposed on said floating gate, a control gate disposed on said inter-gate dielectric, and a silicide layer disposed on said control gate.

3. The method as claimed in claim 2 wherein said multi-layer structure comprises a polysilicon layer disposed on said silicide layer, and a passivation layer disposed on said polysilicon layer, said passivation layer comprises a material selected from the group consisting of nitride and oxynitride.

4. The method as claimed in claim 1 wherein said step of removing said antireflective coating layer is about fifteen times faster than the etch rate of said dielectric layer.

5. The method as claimed in claim 1 wherein said dielectric layer comprises boro-phospho-tetra-ethyl-ortho silicate (BPTEOS).

6. The method as claimed in claim 1 wherein said anti-reflective coating layer comprises a nitride.

7. The method as claimed in claim 1 wherein said anti-reflective coating layer comprises an oxynitride.

8. The method as claimed in claim 1 wherein said anti-reflective coating layer is formed to a thickness below 1100 angstroms.

9. The method as claimed in claim 1 wherein the step of removing said antireflective coating layer using selective plasma etch uses a plasma comprising fluoromethane and oxygen.

10. A method of manufacturing a semiconductor device on a semiconductor substrate, comprising the steps of:
    forming a multi-layer structure on an active region on the semiconductor substrate;
    forming a source region and a drain region on said active region adjacent said multi-layer structure;
    forming sidewall spacers around said multi-layer structure;
    forming a dielectric layer over the semiconductor substrate, including said multi-layer structure, said sidewall spacers, said source region and said drain region, wherein said dielectric layer comprises boro-phospho-tetra-ethyl-ortho silicate (BPTEOS);
    forming an anti-reflective coating layer over said dielectric layer, said anti-reflective coating layer having a top surface;
    forming a masking layer over said anti-reflective coating layer, wherein said antireflective coating layer comprises a nitride;
    patterning said masking layer to form a contact mask;
    forming a first opening and a second opening in said dielectric layer through said anti-reflective coating layer using said contact mask as a mask, said first opening exposes a portion of said source region and said second opening exposes a portion of said drain region;

filling said first opening and said second opening with a conductive material, wherein said conductive material comprises a material selected from a group consisting of tungsten, tantalum, titanium, copper, aluminum, silver, gold, an alloy thereof, polysilicon, and a compound thereof;

planarizing said conductive material smooth with said top surface of said antireflective coating layer; and removing said anti-reflective coating layer using selective plasma etch with a plasma comprising fluoromethane and oxygen to etch said anti-reflective coating layer with reactive ions at a rate which is significantly faster than the etch rates of said dielectric layer or said conductive material.

11. The method as claimed in claim 10 wherein said multi-layer structure comprises a gate dielectric layer, a floating gate disposed on said gate dielectric layer, an inter-gate dielectric disposed on said floating gate, a control gate disposed on said inter-gate dielectric, and a silicide layer disposed on said control gate.

12. The method as claimed in claim 11 wherein said multi-layer structure comprises a polysilicon layer disposed on said silicide layer, and a passivation layer disposed on said polysilicon layer, said passivation layer comprises a material selected from the group consisting of nitride and oxynitride.

13. The method as claimed in claim 10 wherein said anti-reflective coating layer is formed to a thickness in a range around 300 to 1100 angstroms.

14. The method as claimed in claim 10 wherein said anti-reflective coating layer consists of a material selected from a group consisting of silicon oxynitride, silicon nitride, and a combination thereof.

15. A method of manufacturing a semiconductor device on a semiconductor substrate, comprising the steps of:

forming a multi-layer structure on an active region on the semiconductor substrate, wherein said multi-layer structure comprises a gate dielectric layer, a floating gate disposed on said gate dielectric layer, an inter-gate dielectric disposed on said floating gate, a control gate disposed on said inter-gate dielectric, a silicide layer disposed on said control gate, a polysilicon layer disposed on said silicide layer, and a passivation layer disposed on said polysilicon layer, said passivation layer comprises a material selected from the group consisting of nitride and oxynitride;

forming a source region and a drain region on said active region adjacent said multi-layer structure;

forming sidewall spacers around said multi-layer structure;

forming a dielectric layer over the semiconductor substrate, including said multi-layer structure, said sidewall spacers, said source region and said drain region;

forming an anti-reflective coating layer over said dielectric layer, said anti-reflective coating layer having a top surface;

forming a masking layer over said anti-reflective coating layer;

patterning said first masking layer to form a contact mask;

forming a first opening, a second opening, and a third opening in said dielectric layer through said anti-reflective coating layer using said first contact mask as a mask, said first opening exposes a portion of said source region, said second opening exposes a portion of said drain region, and said third opening exposes a portion of said silicide layer;

filling said first opening, said second opening, and said third opening with a conductive material;

planarizing said conductive material smooth with said top surface of said antireflective coating layer; and removing said anti-reflective coating layer using selective plasma etch to etch said anti-reflective coating layer with reactive ions at a rate which is significantly faster than the etch rates of said dielectric layer or said conductive material.

16. The method as claimed in claim 15 wherein said dielectric layer comprises boro-phospho-tetra-ethyl-ortho silicate (BPTEOS).

17. The method as claimed in claim 15 wherein said anti-reflective coating layer consists of a material selected from a group consisting of silicon oxynitride, silicon nitride, and a combination thereof.

18. The method as claimed in claim 15 wherein said anti-reflective coating layer is formed to a thickness in the range of about 300–1100 angstroms.

19. The method as claimed in claim 15 wherein said conductive material comprises a material selected from a group consisting of tungsten, tantalum, titanium, copper, aluminum, silver, gold, an alloy thereof, polysilicon, and a compound thereof.

20. The method as claimed in claim 15 wherein the step of removing said anti-reflective coating layer using selective plasma etch uses a plasma comprising fluoromethane and oxygen etching it about fifteen times faster than the etch rate of said dielectric layer.

* * * * *